(12) United States Patent
Kim et al.

(10) Patent No.: US 9,583,165 B1
(45) Date of Patent: Feb. 28, 2017

(54) SEMICONDUCTOR DEVICE AND SEMICONDUCTOR SYSTEM

(71) Applicant: SK hynix Inc., Icheon-si Gyeonggi-do (KR)

(72) Inventors: Cheol Hoe Kim, Yongin-si (KR); Kyeong Tae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/995,444

(22) Filed: Jan. 14, 2016

(30) Foreign Application Priority Data

Oct. 20, 2015 (KR) .................. 10-2015-0145743

(51) Int. Cl.
  G11C 8/12 (2006.01)
  G11C 8/18 (2006.01)
  G11C 8/10 (2006.01)
  G11C 5/14 (2006.01)

(52) U.S. Cl.
  CPC ............... G11C 8/18 (2013.01); G11C 5/147 (2013.01); G11C 8/10 (2013.01)

(58) Field of Classification Search
  CPC .................................. G11C 5/147; G11C 8/12
  USPC ........................................... 365/230.03, 226
  See application file for complete search history.

(56) References Cited

U.S. PATENT DOCUMENTS

| | | | | |
|---|---|---|---|---|
| 5,410,680 A | * | 4/1995 | Challa | G06F 3/0601 703/24 |
| 7,266,037 B2 | * | 9/2007 | Mochida | G11C 11/4076 365/230.03 |
| 8,184,500 B2 | * | 5/2012 | Song | G11C 7/22 365/230.03 |
| 2009/0002085 A1 | * | 1/2009 | Tarng | G08B 13/19636 331/167 |
| 2011/0043112 A1 | | 2/2011 | Brown et al. | |
| 2011/0211413 A1 | * | 9/2011 | Song | G11C 7/22 365/230.03 |
| 2011/0249523 A1 | * | 10/2011 | Shim | G11C 11/4094 365/203 |

FOREIGN PATENT DOCUMENTS

KR  1020090053908 A  5/2009

* cited by examiner

*Primary Examiner* — Michael Tran
(74) *Attorney, Agent, or Firm* — William Park & Associates Ltd.

(57) ABSTRACT

A semiconductor system includes a first semiconductor device configured to output command addresses; and a second semiconductor device configured to generate a first control signal including a pulse controlled in its pulse width in synchronization with a toggling time of a bank active signal for selecting a bank to be activated in an active operation in response to the command addresses, a second control signal enabled in response to the bank active signal, and an internal voltage in response to the first and second control signals.

19 Claims, 8 Drawing Sheets

SEMICONDUCTOR DEVICE AND SEMICONDUCTOR SYSTEM

CROSS-REFERENCE TO RELATED APPLICATION

The present application claims priority under 35 U.S.C. §119(a) to Korean Patent Application No. 10-2015-0145743, filed on Oct. 20, 2015, in the Korean Intellectual Property Office, which is incorporated herein by reference in its entirety.

BACKGROUND

1. Technical Field

Embodiments of the invention relate to a semiconductor device and a semiconductor system which generate and supply an internal voltage.

2. Related Art

In general, a semiconductor device is supplied with a power supply voltage (VDD) and a ground voltage (VSS) from an exterior, and generates and uses internal voltages which are necessary for internal operations. Voltages necessary for internal operations of a semiconductor device include a core voltage (VCORE) to be supplied to a memory core region, a high voltage (VPP) to be used for driving of a word line or for overdriving, and a low voltage (VBB) to be supplied as a bulk voltage of an NMOS transistor in a core region.

The core voltage (VCORE) may be supplied by reducing the power supply voltage (VDD) inputted from the exterior, to a predetermined level. However, because the high voltage (VPP) has a level higher than the power supply voltage (VDD) inputted from the exterior and the low voltage (VBB) retains a level lower than the ground voltage (VSS) inputted from the exterior, in order to supply the high voltage (VPP) and the low voltage (VBB), pump circuits for supplying charges for the high voltage (VPP) and the low voltage (VBB) are needed.

SUMMARY

In an embodiment, a semiconductor system may include a first semiconductor device configured to output command addresses. The semiconductor system may also include a second semiconductor device configured to generate a first control signal including a pulse controlled in its pulse width in synchronization with a toggling time of a bank active signal for selecting a bank to be activated in an active operation in response to the command addresses; a second control signal enabled in response to the bank active signal; and an internal voltage in response to the first and second control signals.

In an embodiment, a semiconductor device may include an active signal generation block configured to generate first and second bank active signals by decoding command addresses inputted from an exterior source or device. The semiconductor device may also include a control signal generation block configured to generate a first control signal which includes a pulse generated in synchronization with a time when any one signal of the first and second bank active signals toggles, and a second control signal enabled in synchronization with a time when the any one signal of the first and second bank active signals is enabled. The semiconductor device may also include an internal voltage generation block configured to generate an internal voltage in response to the pulse of the first control signal and the second control signal.

In an embodiment, a semiconductor system may include a first semiconductor device configured to output command addresses. The semiconductor system may also include a second semiconductor device configured to receive the command addresses and generate a first control signal including a first pulse and a second pulse generated in synchronization with first to fourth bank active signals and a second control signal enabled in synchronization with a time when any one of the first to fourth bank active signals are enabled.

In an embodiment, the semiconductor system may include an internal voltage generation block configured to drive an internal voltage to a first multiple during an enable period of the second control signal.

In an embodiment, the internal voltage is configured to drive the internal voltage to a second multiple in response to first and second pulses of the first control signal.

In an embodiment, the internal voltage is configured to drive the internal voltage to a second, third, and fourth multiple in response to first and second pulses of the first control signal.

In an embodiment, the semiconductor system may include a pulse width adjusting section configured to generate the first control with a pulse width corresponding to a specific period.

In an embodiment, the specific period is set to be a delay amount of the pulse width adjusting section.

In an embodiment, the internal voltage generation block provides the driven internal voltage to a memory region.

In an embodiment, the first and second pulses of the first control signal are generated to drive the internal voltage when the first to fourth bank active signals toggle.

In an embodiment, the first to fourth bank active signals are generated by partial bits of the command addresses.

In an embodiment, the first to fourth bank active signals are activated at a same time.

In an embodiment, the first to fourth bank active signals are activated at different times.

In an embodiment, the first to fourth bank active signals are set as signals to activate first to fourth banks in a memory region.

In an embodiment, the memory region is driven by the internal voltage in response to the first to fourth bank active signals.

In an embodiment, the first to fourth banks include a plurality of memory cells that input and output data in response to the internal voltage.

In an embodiment, the first to fourth banks are activated when the second semiconductor device enters an active operation.

DETAILED DESCRIPTION

Hereinafter, a semiconductor device and a semiconductor system will be described below with reference to the accompanying figures through various examples of embodiments. Various embodiments are directed to a semiconductor device and a semiconductor system which increase a driving force for driving an internal voltage, during a period in which a current consumption amount suddenly increases in an active operation. According to various embodiments, it is possible to substantially prevent an operation error of an internal circuit, by increasing a driving force for driving an internal voltage, during a period in which a current consumption amount suddenly increases in an active operation. In addition, according to various embodiments, it is possible to reduce a current consumption amount, by increasing a driving force for driving an internal voltage, during only a period in which a current consumption amount suddenly increases in an active operation Referring to FIG. 1, a semiconductor system in accordance with an embodiment may include a first semiconductor device 1 and a second semiconductor device 2. The second semiconductor device 2 may include an active signal generation block 10, a control signal generation block 20, an internal voltage generation block 30, and a memory region 40. The semiconductor system may be configured as a circuit or the like.

Figure 1:
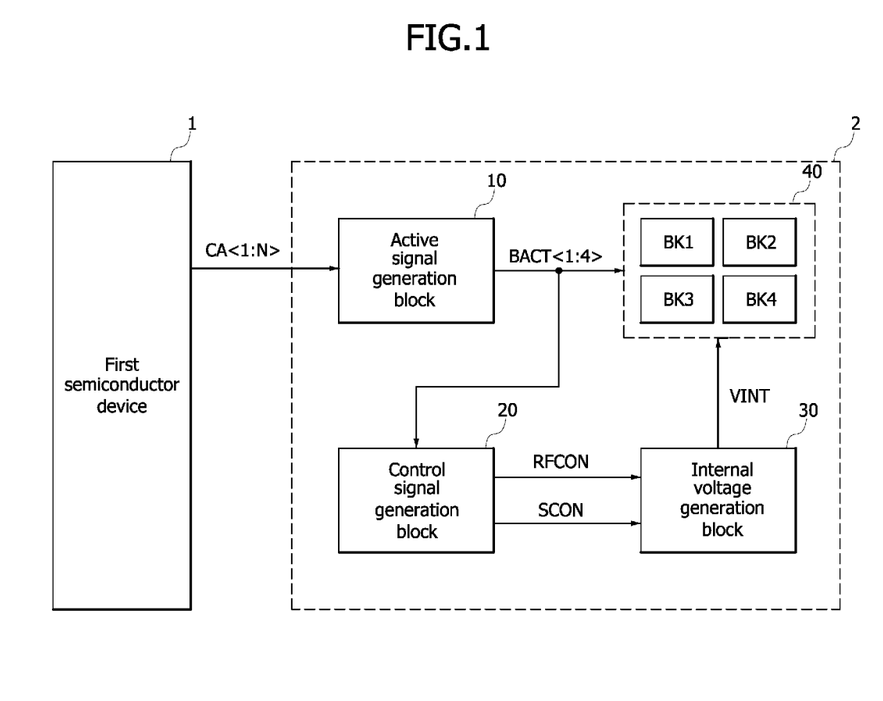
FIG. 1 is a block diagram illustrating a representation of an example of the configuration of a semiconductor system in accordance with an embodiment.

The first semiconductor device 1 may output command addresses CA<1:N>. The command addresses CA<1:N> may be transmitted through lines through which at least ones of addresses, commands and data are transmitted. In addition, the command addresses CA<1:N> may be successively transmitted through one line. The number of bits included in the command addresses CA<1:N> may be set variously according to embodiments.

The active signal generation block 20 may generate first to fourth bank active signals BACT<1:4> according to combinations of the command addresses CA<1:N>. The first to fourth bank active signals BACT<1:4> may be generated by different combinations of the command addresses CA<1:N>. The first to fourth bank active signals BACT<1:4> may be generated by partial bits of the command addresses CA<1:N>. The first to fourth bank active signals BACT<1:4> may be activated at the same time or may be activated at different times. The first to fourth bank active signals BACT<1:4> may be set as signals for activating first to fourth banks BK1 to BK4 included in the memory region 40 as the second semiconductor device 2 enters an active operation.

The control signal generation block 20 may generate a first control signal RFCON which includes a first pulse and a second pulse generated in synchronization with a time when any one among the first to fourth bank active signals BACT<1:4> toggles. The control signal generation block 20 may generate a second control signal SCON which is enabled in synchronization with a time when any one of the first to fourth bank active signals BACT<1:4> is enabled. The second control signal SCON may be generated in synchronization with a disable time of the first to fourth bank active signals BACT<1:4>.

The internal voltage generation block 30 may generate an internal voltage VINT in response to the first and second pulses of the first control signal RFCON and the second control signal SCON. The internal voltage generation block 30 may drive the internal voltage VINT to a first multiple during the enable period of the second control signal SCON, and may drive the internal voltage VINT to a second multiple during a period in which the first and second pulses of the first control signal RFCON are inputted. According to an embodiment, the internal voltage generation block 30 may be realized to drive the internal voltage VINT to an $N^{th}$ multiple during a period in which the first and second pulses of the first control signal RFCON are inputted.

The memory region 40 may include the first to fourth banks BK1 to BK4. The memory region 40 may be driven by being supplied with the internal voltage VINT in response to the first to fourth bank active signals BACT<1:4>. According to an embodiment, the memory region 40 may be realized as a volatile memory device or a nonvolatile memory device including a plurality of banks.

The first bank BK1 includes a plurality of memory cells. The first bank BK1 may input and output data by being supplied with the internal voltage VINT during a period in which the first bank active signal BACT<1> is enabled.

The second bank BK2 includes a plurality of memory cells. The second bank BK2 may input and output data by being supplied with the internal voltage VINT during a period in which the second bank active signal BACT<2> is enabled.

The third bank BK3 includes a plurality of memory cells. The third bank BK3 may input and output data by being supplied with the internal voltage VINT during a period in which the third bank active signal BACT<3> is enabled.

The fourth bank BK4 includes a plurality of memory cells. The fourth bank BK4 may input and output data by being supplied with the internal voltage VINT during a period in which the fourth bank active signal BACT<4> is enabled.

Figure 2:
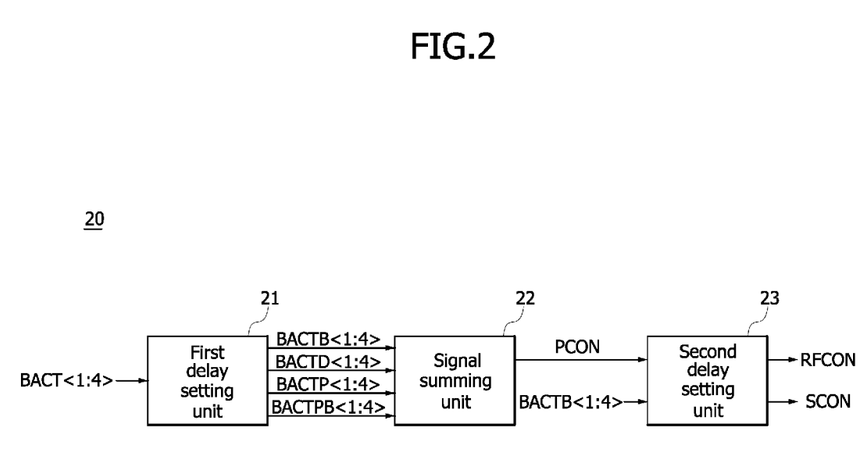
FIG. 2 is a block diagram illustrating a representation of an example of the configuration of the control signal generation block included in the semiconductor system shown in FIG. 1.

Referring to FIG. 2, the control signal generation block 20 in accordance with an embodiment may include a first delay setting unit 21, a signal summing unit 22, and a second delay setting unit 23.

The first delay setting unit 21 may generate first to fourth inverted active signals BACTB<1:4> and first to fourth active delay signals BACTD<1:4> by inverting and buffering the first to fourth bank active signals BACT<1:4>; may generate first to fourth active pulses BACTP<1:4> by delaying the first to fourth active delay signals BACTD<1:4> by a first period; and may generate first to fourth inverted active pulses BACTPB<1:4> by inverting the first to fourth active pulses BACTP<1:4>.

The signal summing unit 22 may generate a first pre-control signal PCON which includes a pulse generated by summing the first to fourth active delay signals BACTD<1:4> and the first to fourth inverted active pulses BACTPB<1:4> and includes a pulse generated by summing the first to fourth inverted active signals BACTB<1:4> and the first to fourth active pulses BACTP<1:4>.

The second delay setting unit 23 may generate the first control signal RFCON by adjusting a pulse width of the pulse of the first pre-control signal PCON. The second delay unit 23 may generate the second control signal SCON which is enabled in response to the first to fourth inverted active signals BACTB<1:4>.

Figure 3:
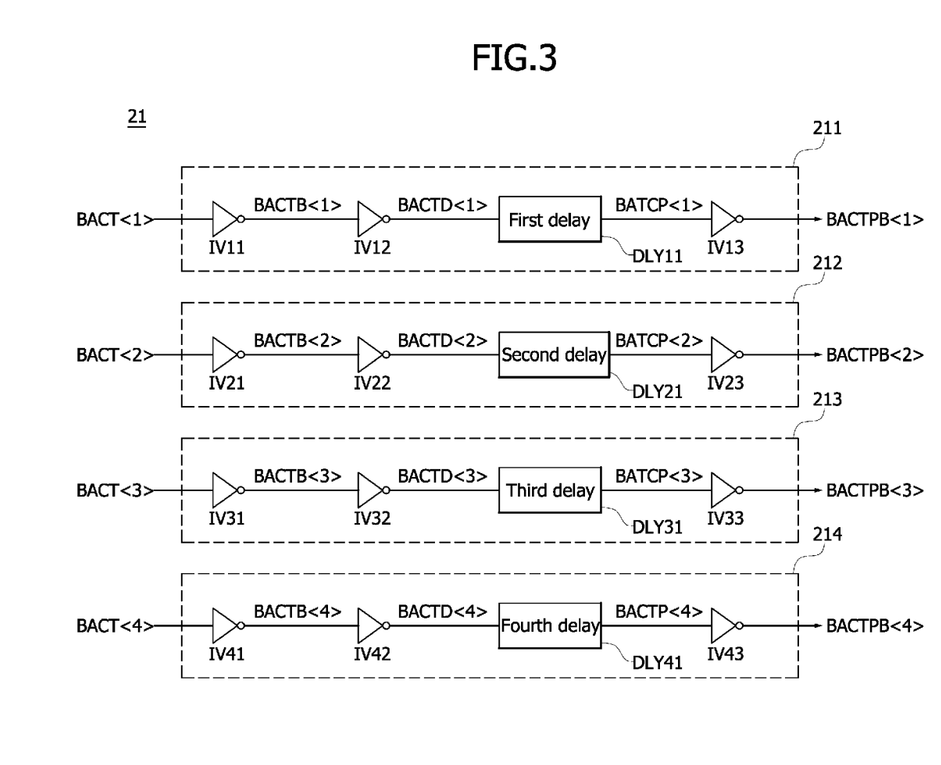
FIG. 3 is a diagram illustrating a representation of an example of the configuration of the first delay setting unit included in the control signal generation block shown in FIG. 2.

Referring to FIG. 3, the first delay setting unit 21 in accordance with an embodiment may include a first delay section 211, a second delay section 212, a third delay section 213, and a fourth delay section 214.

The first delay section 211 may include first to third buffers IV11, IV12 and IV13 and a first delay DLY11. The first buffer IV11 may generate the first inverted active signal BACTB<1> by inverting and buffering the first bank active signal BACT<1>. The second buffer IV12 may generate the first active delay signal BACTD<1> by inverting and buffering the first inverted active signal BACTB<1>. The first delay DLY11 may generate the first active pulse BACTP<1> by delaying the first active delay signal BACTD<1> by the first period. The third buffer IV13 may generate the first inverted active pulse BACTPB<1> by inverting and buffering the first active pulse BACTP<1>.

The second delay section 212 may include fourth to sixth buffers IV21, IV22 and IV23 and a second delay DLY21. The fourth buffer IV21 may generate the second inverted active signal BACTB<2> by inverting and buffering the second bank active signal BACT<2>. The fifth buffer IV22 may generate the second active delay signal BACTD<2> by inverting and buffering the second inverted active signal BACTB<2>. The second delay DLY21 may generate the second active pulse BACTP<2> by delaying the second active delay signal BACTD<2> by the first period. The sixth buffer IV23 may generate the second inverted active pulse BACTPB<2> by inverting and buffering the second active pulse BACTP<2>.

The third delay section 213 may include seventh to ninth buffers IV31, IV32 and IV33 and a third delay DLY31. The seventh buffer IV31 may generate the third inverted active signal BACTB<3> by inverting and buffering the third bank active signal BACT<3>. The eighth buffer IV32 may generate the third active delay signal BACTD<3> by inverting and buffering the third inverted active signal BACTB<3>. The third delay DLY31 may generate the third active pulse BACTP<3> by delaying the third active delay signal BACTD<3> by the first period. The ninth buffer IV33 may generate the third inverted active pulse BACTPB<3> by inverting and buffering the third active pulse BACTP<3>.

The fourth delay section 214 may include tenth to twelfth buffers IV41, IV42 and IV43 and a fourth delay DLY41. The tenth buffer IV41 may generate the fourth inverted active signal BACTB<4> by inverting and buffering the fourth bank active signal BACT<4>. The eleventh buffer IV42 may generate the fourth active delay signal BACTD<4> by inverting and buffering the fourth inverted active signal BACTB<4>. The fourth delay DLY41 may generate the fourth active pulse BACTP<4> by delaying the fourth active delay signal BACTD<4> by the first period. The twelfth buffer IV43 may generate the fourth inverted active pulse BACTPB<4> by inverting and buffering the fourth active pulse BACTP<4>.

Figure 4:
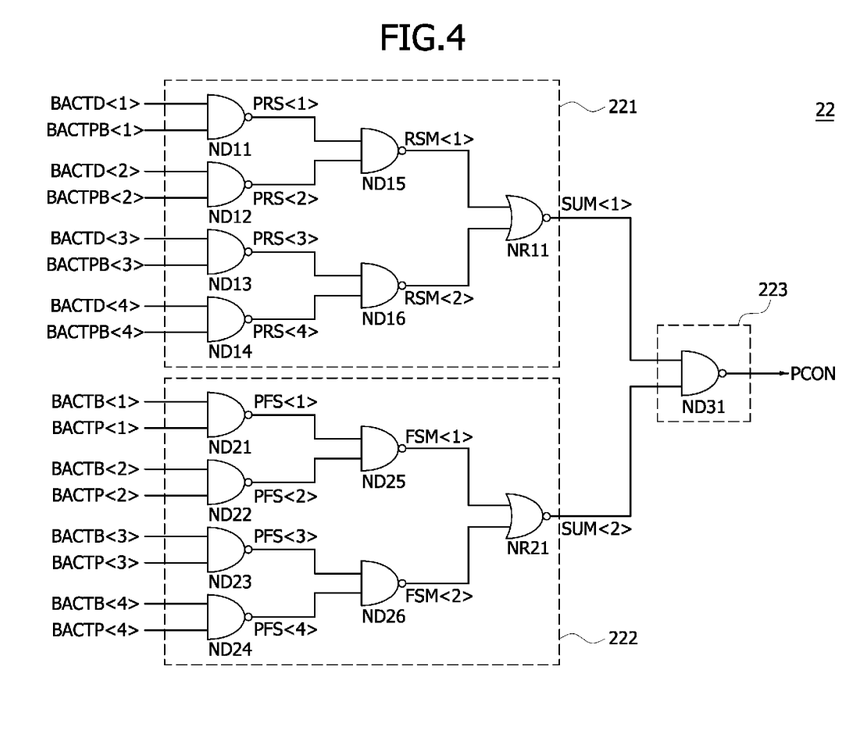
FIG. 4 is a circuit diagram illustrating a representation of an example of the configuration of the signal summing unit included in the control signal generation block shown in FIG. 2.

Referring to FIG. 4, the signal summing unit 22 in accordance with an embodiment may include a first summing section 221, a second summing section 222, and a third signal summing section 223.

The first summing section 221 may be realized by a plurality of NAND gates ND11 to ND16 and a NOR gate NR11. The first summing section 221 may generate a first summed signal SUM<1> by summing the first to fourth active delay signals BACTD<1:4> and the first to fourth inverted active pulses BACTPB<1:4>.

In detail, the operation for the first summing section 221 to generate the first summed signal SUM<1> by summing the first to fourth active delay signals BACTD<1:4> and the first to fourth inverted active pulses BACTPB<1:4> will be described below.

The NAND gate ND11 may generate a first pre-rising summed signal PRS<1> which includes a pulse of a logic low level in the case where the first active delay signal BACTD<1> is inputted at a logic high level and the first inverted active pulse BACTPB<1> is inputted at a logic high level.

The NAND gate ND12 may generate a second pre-rising summed signal PRS<2> which includes a pulse of a logic low level in the case where the second active delay signal BACTD<2> is inputted at a logic high level and the second inverted active pulse BACTPB<2> is inputted at a logic high level.

The NAND gate ND13 may generate a third pre-rising summed signal PRS<3> which includes a pulse of a logic low level in the case where the third active delay signal BACTD<3> is inputted at a logic high level and the third inverted active pulse BACTPB<3> is inputted at a logic high level.

The NAND gate ND14 may generate a fourth pre-rising summed signal PRS<4> which includes a pulse of a logic low level in the case where the fourth active delay signal BACTD<4> is inputted at a logic high level and the fourth inverted active pulse BACTPB<4> is inputted at a logic high level.

The NAND gate ND15 may generate a first rising summed signal RSM<1> which includes a pulse generated as a logic high level where any one of the first pre-rising summed signal PRS<1> and the second pre-rising summed signal PRS<2> is inputted at a logic low level.

The NAND gate ND16 may generate a second rising summed signal RSM<2> which includes a pulse generated as a logic high level in the case where any one of the third pre-rising summed signal PRS<3> and the fourth pre-rising summed signal PRS<4> is inputted at a logic low level.

The NOR gate NR11 may generate the first summed signal SUM<1> which includes a pulse generated as a logic low level where any one of the first rising summed signal RSM<1> and the second rising summed signal RSM<2> is inputted at a logic high level.

The second summing section 222 may be realized by a plurality of NAND gates ND21 to ND26 and a NOR gate NR21. The second summing section 222 may generate a second summed signal SUM<2> by summing the first to fourth inverted active signals BACTB<1:4> and the first to fourth active pulses BACTP<1:4>.

In detail, the operation for the second summing section 222 to generate the second summed signal SUM<2> by summing the first to fourth inverted active signals BACTB<1:4> and the first to fourth active pulses BACTP<1:4> will be described below.

The NAND gate ND21 may generate a first pre-falling summed signal PFS<1> which includes a pulse of a logic low level where the first inverted active signal BACTB<1> is inputted at a logic high level and the first active pulse BACTP<1> is inputted at a logic high level.

The NAND gate ND22 may generate a second pre-falling summed signal PFS<2> which includes a pulse of a logic low level where the second inverted active signal BACTB<2> is inputted at a logic high level and the second active pulse BACTP<2> is inputted at a logic high level.

The NAND gate ND23 may generate a third pre-falling summed signal PFS<3> which includes a pulse of a logic low level where the third inverted active signal BACTB<3> is inputted at a logic high level and the third active pulse BACTP<3> is inputted at a logic high level.

The NAND gate ND24 may generate a fourth pre-falling summed signal PFS<4> which includes a pulse of a logic low level where the fourth inverted active signal BACTB<4> is inputted at a logic high level and the fourth active pulse BACTP<4> is inputted at a logic high level.

The NAND gate ND25 may generate a first falling summed signal FSM<1> which includes a pulse generated as a logic high level where any one of the first pre-falling summed signal PFS<1> and the second pre-falling summed signal PFS<2> is inputted at a logic low level.

The NAND gate ND26 may generate a second falling summed signal FSM<2> which includes a pulse generated as a logic high level where any one of the third pre-falling summed signal PFS<3> and the fourth pre-falling summed signal PFS<4> is inputted at a logic low level.

The NOR gate NR21 may generate the second summed signal SUM<2> which includes a pulse generated as a logic low level where any one of the first falling summed signal FSM<1> and the second falling summed signal FSM<2> is inputted at a logic high level.

The third summing section 223 may be realized by a NAND gate ND31. The third summing section 223 may generate the first pre-control signal PCON by summing the first summed signal SUM<1> and the second summed signal SUM<2>.

In detail, the operation for the third summing section 223 to generate the first pre-control signal PCON by summing the first summed signal SUM<1> and the second summed signal SUM<2> will be described below.

The NAND gate ND31 may generate the first pre-control signal PCON which includes a pulse generated as a logic high level in the case where any one of the first summed signal SUM<1> and the second summed signal SUM<2> is inputted at a logic low level.

Figure 5:
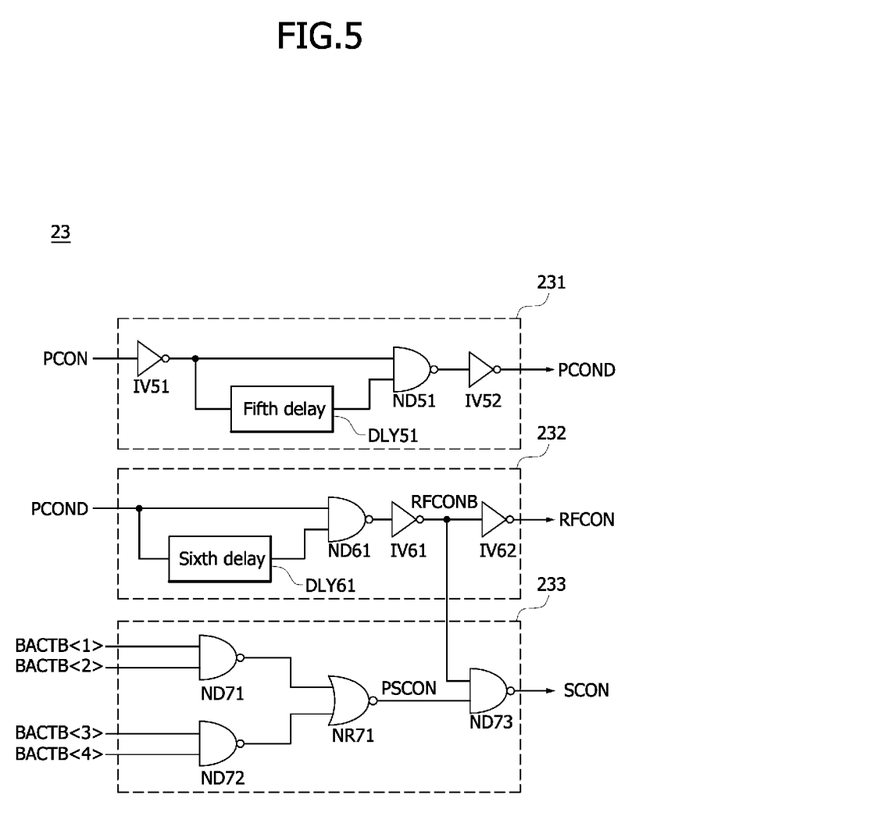
FIG. 5 is a circuit diagram illustrating a representation of an example of the configuration of the second delay setting unit included in the control signal generation block shown in FIG. 2.

Referring to FIG. 5, the second delay setting unit 23 in accordance with an embodiment may include a first pulse width adjusting section 231, a second pulse width adjusting section 232, and a logic section 233.

The first pulse width adjusting section 231 may be realized by inverters IV51 and IV52, a fifth delay DLY51 and a NAND gate ND51. The first pulse with adjusting section 231 may generate a delay control signal PCOND which includes a pulse generated for a second period from a time when the pulse of the first pre-control signal PCON is generated. The pulse width of the delay control signal PCOND generated for the second period may be set as a delay amount of the fifth delay DLY51.

The second pulse width adjusting section 232 may be realized by inverters IV61 and IV62, a sixth delay DLY61 and a NAND gate ND61. The second pulse with adjusting section 232 may generate an inverted control signal RFCONB which includes a pulse generated for a third period from a time when the pulse of the delay control signal PCOND is generated; and may generate the first control signal RFCON by inverting and buffering the inverted control signal RFCONB. The pulse width of the first control signal RFCON generated for the third period may be set as a delay amount of the sixth delay DLY61.

The logic section 233 may be realized by NAND gates ND71, ND72 and ND73 and a NOR gate NR71. The logic section 233 may generate the second control signal SCON which is enabled in response to the first to fourth inverted active signals BACTB<1:4>. The logic section 233 may generate a second pre-control signal PSCON which is enabled in synchronization with a time when any one of the first to fourth inverted active signals BACTB<1:4> is enabled. The logic section 233 may generate the second control signal SCON in response to the inverted control signal RFCONB and the second pre-control signal PSCON.

Figure 6:
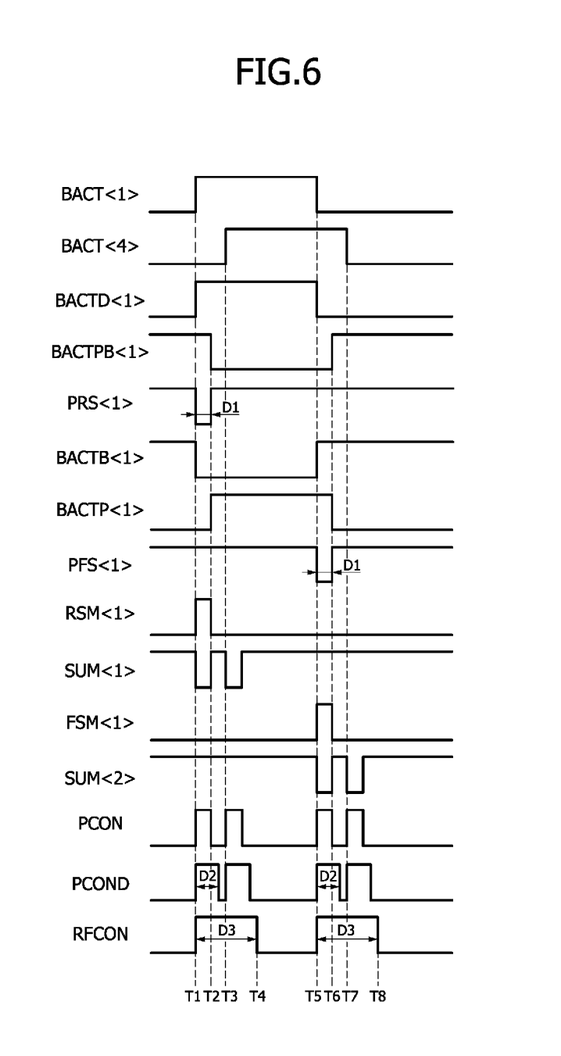
FIGS. 6 and 7 are representations of examples of timing diagrams to assist in the explanation of operations of the semiconductor system in accordance with an embodiment.
Figure 7:
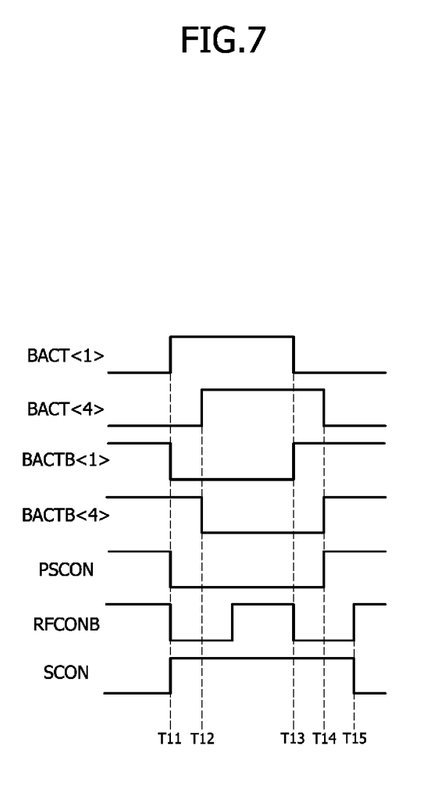

Operations of the semiconductor system in accordance with an embodiment will be described below with reference to FIGS. 6 and 7. Operations for driving an internal voltage by generating control signals by the first bank active signal BACT<1> and the fourth bank active signal BACT<4> generated as an active operation is entered by the command addresses CA<1:N> will be described.

First, an operation for generating the first control signal RFCON by the first bank active signal BACT<1> and the fourth bank active signal BACT<4> will be described below with reference to FIG. 6.

At a time T1, the first semiconductor device 1 outputs the command addresses CA<1:N>.

The active signal generation block 10 generates the first bank active signal BACT<1> to a logic high level according to a combination of the command addresses CA<1:N>.

The first delay setting unit 21 inverts and buffers the first bank active signal BACT<1>, and generates the first inverted active signal BACTB<1> of a logic low level and the first active delay signal BACTD<1> of a logic high level. The first delay setting unit 21 generates the first active pulse BACTP<1> of a logic low level and the first inverted active pulse BACTPB<1> of a logic high level.

The first summing section 221 of the signal summing unit 22 is inputted with the first active delay signal BACTD<1> of the logic high level and the first inverted active pulse BACTPB<1> of the logic high level. The first summing section 221 generates the first pre-rising summed signal PRS<1> of the logic low level, the first rising summed signal RSM<1> of the logic high level and the first summed signal SUM<1> of the logic low level.

At a time T2, the first summing section 221 is inputted with the first inverted active pulse BACTPB<1> of a logic low level and generates the first pre-rising summed signal PRS<1> of a logic high level. The pulse width of the first pre-rising summed signal PRS<1> generated to the logic low level from the time T1 to the time T2 is set as a first period D1. In addition, the pulse widths of the first rising summed signal RSM<1> and the first summed signal SUM<1> are set as the first period D1 the same as the first pre-rising summed signal PRS<1>. It is meant that the first period D1 is set as a delay amount of the first delay DLY11 of the first delay section 211.

The second summing section 222 is inputted with the first inverted active signal BACTB<1> of the logic low level and the first active pulse BACTP<1> of the logic low level. The second summing section 222 generates the first pre-falling summed signal PFS<1> of a logic high level, the first falling summed signal FSM<1> of a logic low level and the second summed signal SUM<2> of a logic high level.

The third summing section 223 is inputted with the first summed signal SUM<1> of the logic low level and the second summed signal SUM<2> of the logic high level, and generates the first pre-control signal PCON of the logic high level.

The first pulse width adjusting section 231 of the second delay setting unit 23 is inputted with the first pre-control signal PCON of the logic high level. The first pulse width adjusting section 231 generates the delay control signal PCOND of a logic low level.

The first pulse width adjusting section 231 generates the delay control signal PCOND which has a pulse width corresponding to a second period D2 from the time T1. It is meant that the second period D2 is set as a delay amount of the fifth delay DLY51 of the first pulse width adjusting section 231.

The second pulse width adjusting section 232 is inputted with the delay control signal PCOND of the logic low level, and generates the first control signal RFCON of a logic high level.

The second pulse width adjusting section 232 generates the first control signal RFCON which has a pulse width corresponding to a third period D3 from the time T1 to a time T4. It is meant that the third period D3 is set as a delay amount of the sixth delay DLY61 of the second pulse width adjusting section 232.

At a time T3, the first semiconductor device 1 outputs the command addresses CA<1:N>.

The active signal generation block 10 generates the fourth bank active signal BACT<4> to a logic high level according to a combination of the command addresses CA<1:N>. Since signals to be generated by the fourth bank active signal BACT<4> are generated through the same operations as the above-described signals generated by the first bank active signal BACT<1>, detailed descriptions thereof will be omitted herein.

At a time T5, the first semiconductor device 1 outputs the command addresses CA<1:N>.

The active signal generation block 10 generates the first bank active signal BACT<1> to a logic low level according to a combination of the command addresses CA<1:N>.

The first delay setting unit 21 inverts and buffers the first bank active signal BACT<1>. The first delay setting unit 21 generates the first inverted active signal BACTB<1> of a logic high level and the first active delay signal BACTD<1> of a logic low level. The first delay setting unit 21 generates the first active pulse BACTP<1> of a logic high level and the first inverted active pulse BACTPB<1> of the logic low level.

The first summing section 221 of the signal summing unit 22 is inputted with the first active delay signal BACTD<1> of the logic low level and the first inverted active pulse BACTPB<1> of the logic low level. The first summing section 221 generates the first pre-rising summed signal PRS<1> of the logic high level, the first rising summed signal RSM<1> of a logic low level and the first summed signal SUM<1> of a logic high level.

The second summing section 222 is inputted with the first inverted active signal BACTB<1> of the logic high level and the first active pulse BACTP<1> of the logic high level. The second summing section 222 also generates the first pre-falling summed signal PFS<1> of the logic low level, the first falling summed signal RSM<1> of the logic high level and the second summed signal SUM<2> of the logic low level.

At a time T6, the second summing section 222 is inputted with the first active pulse BACTP<1> of the logic low level and generates the first pre-falling summed signal PFS<1> of the logic high level. The pulse width of the first pre-falling summed signal PFS<1> generated to the logic low level from the time T5 to the time T6 is set as the first period D1. In addition, the pulse widths of the first falling summed signal FSM<1> and the second summed signal SUM<2> are set as the first period D1 the same as the first pre-falling summed signal PFS<1>. It is meant that the first period D1 is set as a delay amount of the first delay DLY11 of the first delay section 211.

The third summing section 223 is inputted with the first summed signal SUM<1> of the logic high level and the second summed signal SUM<2> of the logic low level. The third summing section 223 also generates the first pre-control signal PCON of the logic high level.

The first pulse width adjusting section 231 of the second delay setting unit 23 is inputted with the first pre-control signal PCON of the logic high level. The first pulse width adjusting section 231 also generates the delay control signal PCOND of the logic low level.

The first pulse width adjusting section 231 generates the delay control signal PCOND which has a pulse width corresponding to the second period D2 from the time T5. It is meant that the second period D2 is set as a delay amount of the fifth delay DLY51 of the first pulse width adjusting section 231.

The second pulse width adjusting section 232 is inputted with the delay control signal PCOND of the logic low level. The second pulse width adjusting section 232 also generates the first control signal RFCON of the logic high level.

The second pulse width adjusting section 232 generates the first control signal RFCON which has a pulse width corresponding to the third period D3 from the time T5 to a time T8. It is meant that the third period D3 is set as a delay amount of the sixth delay DLY61 of the second pulse width adjusting section 232.

At a time T7, the first semiconductor device 1 outputs the command addresses CA<1:N>.

The active signal generation block 10 generates the fourth bank active signal BACT<4> to a logic low level according to a combination of the command addresses CA<1:N>. Since signals to be generated by the fourth bank active signal BACT<4> are generated through the same operations as the above-described signals generated by the first bank active signal BACT<1>, detailed descriptions thereof will be omitted herein.

The internal voltage generation block 30 drives the internal voltage VINT to the second multiple or the $N^{th}$ multiple during periods in which the first and second pulses of the first control signal RFCON are inputted. The internal voltage generation block 30 supplies the driven internal voltage VINT to the memory region 40.

Next, an operation for generating the second control signal SCON by the first bank active signal BACT<1> and the fourth bank active signal BACT<4> will be described below with reference to FIG. 7.

At a time T11, the first semiconductor device 1 outputs the command addresses CA<1:N>.

The active signal generation block 10 generates the first bank active signal BACT<1> to the logic high level according to a combination of the command addresses CA<1:N>.

The first delay section 211 of the first delay setting unit 21 inverts the first bank active signal BACT<1>. The first delay section 211 also generates the first inverted active signal BACTB<1> of the logic low level.

The logic section 233 of the second delay setting unit 23 generates the second pre-control signal PSCON of a logic low level and the second control signal SCON enabled to a logic high level in response to the first inverted active signal BACTB<1> of the logic low level. The second pulse width adjusting section 232 generates the inverted control signal RFCONB to a logic low level. The time T11 is the same time as the above-described time T1 of FIG. 6.

At a time T12, the first semiconductor device 1 outputs the command addresses CA<1:N>.

The active signal generation block 10 generates the fourth bank active signal BACT<4> to the logic high level according to a combination of the command addresses CA<1:N>.

The fourth delay section 214 of the first delay setting unit 21 inverts the fourth bank active signal BACT<4>. The fourth delay section 214 also generates the fourth inverted active signal BACTB<4> of a logic low level.

The logic section 233 of the second delay setting unit 23 generates the second pre-control signal PSCON of the logic low level and the second control signal SCON enabled to the logic high level in response to the fourth inverted active signal BACTB<4> of the logic low level. The second pulse width adjusting section 232 generates the inverted control signal RFCONB to the logic low level. The time T12 is the same time as the above-described time T3 of FIG. 6.

At a time T13, the first semiconductor device 1 outputs the command addresses CA<1:N>.

The active signal generation block 10 generates the first bank active signal BACT<1> to the logic low level according to a combination of the command addresses CA<1:N>.

The first delay section 211 of the first delay setting unit 21 inverts the first bank active signal BACT<1>, and generates the first inverted active signal BACTB<1> of the logic high level.

The logic section 233 of the second delay setting unit 23 generates the second pre-control signal PSCON of the logic low level and the second control signal SCON enabled to the logic high level in response to the first inverted active signal BACTB<1> of the logic high level. The second pulse width adjusting section 232 generates the inverted control signal RFCONB to the logic low level. The time T13 is the same time as the above-described time T5 of FIG. 6.

At a time T14, the first semiconductor device 1 outputs the command addresses CA<1:N>.

The active signal generation block 10 generates the fourth bank active signal BACT<4> to the logic low level according to a combination of the command addresses CA<1:N>.

The fourth delay section 214 of the first delay setting unit 21 inverts the fourth bank active signal BACT<4>. The fourth delay section 214 generates the fourth inverted active signal BACTB<4> of a logic high level.

The logic section 233 of the second delay setting unit 23 generates the second pre-control signal PSCON of a logic high level and the second control signal SCON enabled to the logic high level in response to the fourth inverted active signal BACTB<4> of the logic high level. The second pulse width adjusting section 232 generates the inverted control signal RFCONB to the logic low level. The time T14 is the same time as the above-described time T7 of FIG. 6.

At a time T15, the second pulse width adjusting section 232 generates the inverted control signal RFCONB to a logic high level.

The logic section 233 of the second delay setting unit 23 generates the second control signal SCON disabled to a logic low level in response to the inverted control signal RFCONB of the logic high level and the second pre-control signal PSCON of the logic high level.

The internal voltage generation block 30 drives the internal voltage VINT to the first multiple during a period in which the pulse of the second control signal SCON is inputted. The internal voltage generation block 30 supplies the driven internal voltage VINT to the memory region 40.

The semiconductor device according to an embodiment may increase a driving force for driving the internal voltage VINT by generating the pulses of the first control signal RFCON for driving the internal voltage VINT at times when the first to fourth bank active signals BACT<1:4> toggle and thus a current consumption amount suddenly increases in an active operation.

As is apparent from the above descriptions, in the semiconductor device according to an embodiment, it is possible to substantially prevent an operation error of an internal circuit, by increasing a driving force for driving an internal voltage during a period in which a current consumption amount suddenly increases in an active operation. In addition, in the semiconductor device according to an embodiment, it is possible to reduce a current consumption amount, by increasing a driving force for driving an internal voltage during only a period in which a current consumption amount suddenly increases in an active operation.

The semiconductor devices and the semiconductor system described above with reference to FIGS. 1 to 7 may be applied to an electronic system which includes a memory system, a graphic system, a computing system or a mobile system. For example, referring to FIG. 8, an electronic system 1000 in accordance with an embodiment may include a data storage 1001, a memory controller 1002, a buffer memory 1003, and an input/output interface 1004.

Figure 8:
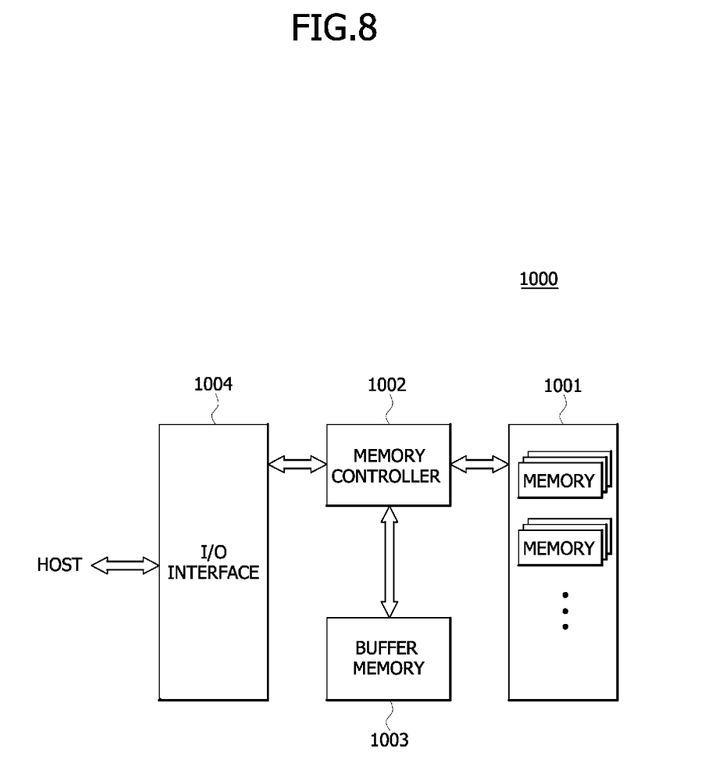
FIG. 8 is a diagram illustrating a representation of an example of the configuration of an electronic system to which the semiconductor devices and the semiconductor system shown in FIGS. 1 to 7 are applied.

The data storage 1001 stores data applied from the memory controller 1002, and reads out stored data and outputs the read-out data to the memory controller 1002, according to control signals from the memory controller 1002. The data storage 1001 may include the second semiconductor device 2 shown in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 1 shown in FIG. 1. While the memory controller 1002 is illustrated as one block in FIG. 8, in the memory controller 1002, a controller for controlling the nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor system comprising:
   a first semiconductor device configured to output command addresses; and
   a second semiconductor device configured to generate a first control signal including a pulse controlled in its pulse width in synchronization with a toggling time of a bank active signal for selecting a bank to be activated in an active operation in response to the command addresses, a second control signal enabled in response to the bank active signal, and an internal voltage in response to the first and second control signals,
   wherein the first control signal includes a first pulse which is generated in synchronization with an enable time of the bank active signal and a second pulse which is generated in synchronization with a disable time of the bank active signal.

2. The semiconductor system according to claim 1, wherein the internal voltage is driven to an integral multiple in response to the pulse of the first control signal during an enable period of the second control signal.

3. The semiconductor system according to claim 1, wherein the second semiconductor device comprises:
   an active signal generation block configured to generate the bank active signal which is enabled in an active mode according to a combination of the command addresses;
   a control signal generation block configured to generate the first control signal which includes the first pulse and the second pulse generated in synchronization with times when the bank active signal toggles, and the second control signal which is enabled in synchronization with a time when the bank active signal is enabled; and
   an internal voltage generation block configured to drive the internal voltage in response to the first and second pulses of the first control signal and the second control signal, and supply the driven internal voltage to a memory region.

4. The semiconductor system according to claim 3, wherein the control signal generation block comprises:
   a first delay setting circuit configured to generate an inverted active signal and an active delay signal by inverting and buffering the bank active signal, generate an active pulse by delaying the active delay signal by a first period, and generate an inverted active pulse by inverting the active pulse;
   a signal summing circuit configured to generate a pre-control signal which includes a third pulse generated by summing the active delay signal and the inverted active pulse and a fourth pulse generated by summing the inverted active signal and the active pulse; and
   a second delay setting circuit configured to generate the first control signal which includes the first and second pulses generated by controlling pulse widths of the third and fourth pulses of the pre-control signal, and generate the second control signal which is enabled in response to the inverted active signal.

5. The semiconductor system according to claim 4, wherein the first delay setting circuit comprises:
   a first buffer configured to generate the inverted active signal by inverting and buffering the bank active signal;
   a second buffer configured to generate the active delay signal by inverting and buffering the inverted active signal;
   a first delay configured to generate the active pulse by delaying the active delay signal by the first period; and
   a third buffer configured to generate the inverted active pulse by inverting and buffering the active pulse.

6. The semiconductor system according to claim 4, wherein the signal summing circuit comprises:
   a first summing section configured to generate a first summed signal which includes a pulse generated by summing the active delay signal and the inverted active pulse;
   a second summing section configured to generate a second summed signal which includes a pulse generated by summing the inverted active signal and the active pulse; and
   a third summing section configured to generate the pre-control signal by summing the first summed signal and the second summed signal.

7. The semiconductor system according to claim 5, wherein the second delay setting circuit comprises:
   a first pulse width adjusting section configured to generate a delay control signal which includes a pulse generated during a second period from a time when the pulse of the pre-control signal is generated;
   a second pulse width adjusting section configured to generate the first control signal which includes the first and second pulses generated during a third period from a time when the pulse of the delay control signal is generated; and
   a logic section configured to generate the second control signal which is enabled in response to the inverted active signal.

8. The semiconductor system according to claim 7, wherein the first pulse width adjusting section comprises a second delay which delays the pulse of the pre-control signal by the second period.

9. The semiconductor system according to claim 7, wherein the second pulse width adjusting section comprises a third delay which delays the pulse of the delay control signal by the third period.

10. A semiconductor device comprising:
    an active signal generation block configured to generate first and second bank active signals by decoding command addresses inputted from an exterior source or device;
    a control signal generation block configured to generate a first control signal which includes a pulse generated in synchronization with a time when any one signal of the first and second bank active signals toggles, and a second control signal enabled in synchronization with a time when the any one signal of the first and second bank active signals is enabled; and
    an internal voltage generation block configured to generate an internal voltage in response to the pulse of the first control signal and the second control signal.

11. The semiconductor device according to claim 10, wherein the internal voltage is driven to an integral multiple in response to the pulse of the first control signal during an enable period of the second control signal.

12. The semiconductor device according to claim 10, wherein the first control signal includes a first pulse which is generated in synchronization with an enable time of the first bank active signal or the second bank active signal and a second pulse which is generated in synchronization with a disable time of the first bank active signal or the second bank active signal.

13. The semiconductor device according to claim 12, wherein the control signal generation block comprises:
   a first delay setting circuit configured to generate first and second inverted active signals and first and second active delay signals by inverting and buffering the first and second bank active signals, generate first and second active pulses by delaying the first and second active delay signals by a first period, and generate first and second inverted active pulses by inverting the first and second active pulses;
   a signal summing circuit configured to generate a pre-control signal which includes a third pulse generated by summing the first and second active delay signals and the first and second inverted active pulses and a fourth pulse generated by summing the first and second inverted active signals and the first and second active pulses; and
   a second delay setting circuit configured to generate the first control signal which includes the first and second pulses generated by controlling pulse widths of the third and fourth pulses of the pre-control signal, and generate the second control signal which is enabled in response to the first and second inverted active signals.

14. The semiconductor device according to claim 13, wherein the first delay setting circuit comprises:
   a first delay section configured to generate the first inverted active signal and the first active delay signal by inverting and buffering the first bank active signal, generate the first active pulse by delaying the first active delay signal by the first period, and generate the first inverted active pulse by inverting the first active pulse; and
   a second delay section configured to generate the second inverted active signal and the second active delay signal by inverting and buffering the second bank active signal, generate the second active pulse by delaying the second active delay signal by the first period, and generate the second inverted active pulse by inverting the second active pulse.

15. The semiconductor device according to claim 13, wherein the signal summing circuit comprises:
   a first summing section configured to generate a first summed signal which includes a pulse generated by summing the first and second active delay signals and the first and second inverted active pulses;
   a second summing section configured to generate a second summed signal which includes a pulse generated by summing the first and second inverted active signals and the first and second active pulses; and
   a third summing section configured to generate the pre-control signal by summing the first summed signal and the second summed signal.

16. The semiconductor device according to claim 13, wherein the second delay setting circuit comprises:
   a first pulse width adjusting section configured to generate a delay control signal which includes a pulse generated during a second period from a time when the pulse of the pre-control signal is generated;
   a second pulse width adjusting section configured to generate the first control signal which includes the first and second pulses generated during a third period from a time when the pulse of the delay control signal is generated; and
   a logic section configured to generate the second control signal which is enabled in response to the first and second inverted active signals.

17. The semiconductor device according to claim 16, wherein the first pulse width adjusting section comprises a first delay which delays the pulse of the pre-control signal by the second period.

18. The semiconductor device according to claim 17, wherein the second pulse width adjusting section comprises a second delay which delays the pulse of the delay control signal by the third period.

19. The semiconductor device according to claim 10, further comprising:
   a memory region including first and second banks which are activated in response to the first and second bank active signals and are driven by being supplied with the internal voltage.

* * * * *